US008193873B2

(12) United States Patent
Kato et al.

(10) Patent No.: US 8,193,873 B2

(45) Date of Patent: Jun. 5, 2012

(54) HIGH-FREQUENCY COUPLER AND COMMUNICATION DEVICE

(75) Inventors: Noboru Kato, Takatsuki (JP); Jun Sasaki, Kyoto (JP); Teppei Miura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/159,491

(22) Filed: Jun. 14, 2011

(65) Prior Publication Data

US 2011/0241804 A1 Oct. 6, 2011

Related U.S. Application Data

(63) Continuation of application No. PCT/JP2009/070301, filed on Dec. 3, 2009.

(30) Foreign Application Priority Data

Dec. 15, 2008 (JP) ................................ 2008-318996

(51) Int. Cl.
*H03H 2/00* (2006.01)
*H01Q 19/10* (2006.01)

(52) U.S. Cl. ............................... 333/24 R; 343/700 MS

(58) Field of Classification Search ................ 333/24 R; 343/802, 816, 818, 819, 700 MS
See application file for complete search history.

(56) References Cited

U.S. PATENT DOCUMENTS

| | | | | |
|---|---|---|---|---|
| 7,262,740 | B2 * | 8/2007 | Tikhov et al. | 343/770 |
| 2004/0183742 | A1 | 9/2004 | Goff et al. | |
| 2005/0104789 | A1 | 5/2005 | Hashidate et al. | |
| 2008/0143630 | A1 | 6/2008 | Kato et al. | |
| 2009/0121949 | A1 * | 5/2009 | Washiro | 343/702 |
| 2011/0279340 | A1 * | 11/2011 | Kato et al. | 343/793 |
| 2012/0001705 | A1 * | 1/2012 | Nozue et al. | 333/24 R |

FOREIGN PATENT DOCUMENTS

| | | | |
|---|---|---|---|
| EP | 1 898 530 | A2 | 3/2008 |
| JP | 2005-051536 | A | 2/2005 |
| JP | 2007-523562 | A | 8/2007 |
| JP | 2008-099236 | A | 4/2008 |
| JP | 2008-160874 | A | 7/2008 |

OTHER PUBLICATIONS

Official Communication issued in International Patent Application No. PCT/JP2009/070301, mailed on Mar. 9, 2010.

* cited by examiner

*Primary Examiner* — Dean O Takaoka
(74) *Attorney, Agent, or Firm* — Keating & Bennett, LLP

(57) ABSTRACT

A high-frequency coupler and a communication device are compact, capable of efficiently communicating a large volume of data over a short distance and can be used in combination with a non-contact IC card. The high-frequency coupler includes magnetic-field-generating patterns and a surrounding pattern disposed around a periphery thereof, and is used to communicate a large volume of data over a short distance in a communication system that uses broadband frequencies. Out of the magnetic fields radiated in directions perpendicular or substantially perpendicular to the plane of the patterns from the magnetic-field-generating patterns, portions extending laterally in the plane of the patterns are blocked by the surrounding pattern, the magnetic fields are lengthened in a direction perpendicular or substantially perpendicular to the plane of the patterns and the communication distance is increased.

19 Claims, 8 Drawing Sheets

HIGH-FREQUENCY COUPLER AND COMMUNICATION DEVICE

BACKGROUND OF THE INVENTION

1. Field of the Invention

The present invention relates to high-frequency couplers and, in particular, to high-frequency couplers and communication devices capable of being used in communication of large volumes of data over short distances.

2. Description of the Related Art

In recent years, communication systems in which broadband frequencies are used to transfer large volumes of data, such as images or music, by transmission and reception of radio signals have been attracting attention. By using such a communication system, a large volume of data on the order of 500 Mbps can be transmitted and received over a short distance (on the order of 30 mm) by using a broad frequency band of 1 GHz and higher.

Generally, when an electric field coupling system or an electromagnetic induction system is used for couplers (antennas) for performing communication using high-frequency signals, the energy decreases in proportion to the communication distance. It is known that the energy decreases in proportion to the cube of the distance in electric field coupling. In contrast, the energy decreases in proportion to the square of the distance in magnetic field coupling. This makes it possible to perform communication over a short distance without receiving interference from other communication devices. When communication is performed using high-frequency signals of 1 GHz or higher, since the wavelength of high-frequency signals is relatively short, transmission loss is generated in accordance with the distance. Consequently, there is a need to transmit high-frequency signals efficiently.

As described in Japanese Unexamined Patent Application Publication No. 2008-99236, a high-frequency coupler, in order to communicate a large volume of data between information appliances using a communication system in which broadband frequencies are used, transmits energy primarily through electric field coupling. However, the energy decreases in proportion to the cube of the distance in electric field coupling and, therefore, since the communication distance is also considerably decreased when the size of couplers is reduced, it has been difficult to reduce the size of couplers. Furthermore, a parallel inductor is provided in the high-frequency coupler described in Japanese Unexamined Patent Application Publication No. 2008-99236 in order to improve the transmission efficiency. However, there have been problems in that a certain thickness is required in order to provide a parallel inductor and, moreover, it is also necessary to provide a ground electrode to connect the parallel inductor to the ground, which results in the size of the coupler itself being increased.

SUMMARY OF THE INVENTION

To overcome the problems described above, preferred embodiments of the present invention provide a high-frequency coupler and a communication device that have a small size and with which a large volume of data can be efficiently communicated over a short distance and a high-frequency coupler and a communication device that can be used in combination with a non-contact IC card.

A high-frequency coupler according to a preferred embodiment of the present invention preferably includes a magnetic-field-generating pattern that generates a magnetic field in a certain direction, and a surrounding pattern that is arranged around a periphery of the magnetic-field-generating pattern and that blocks a portion of the magnetic field generated by the magnetic-field-generating pattern, the portion of the magnetic field extending laterally in a plane of the patterns.

A communication device according to a preferred embodiment of the present invention preferably includes a high-frequency coupler that includes a magnetic-field-generating pattern that generates a magnetic field in a certain direction and a surrounding pattern that is arranged around a periphery of the magnetic-field-generating pattern and that blocks a portion of the magnetic field generated by the magnetic-field-generating pattern, the portion of the magnetic field extending laterally in a plane of the patterns, and a communication circuit unit that processes high-frequency signals used to transmit data.

In the high-frequency coupler and the communication device, a magnetic field is preferably radially generated by the magnetic-field-generating pattern and the portion of the magnetic field that extends laterally in the plane of the patterns is blocked by the surrounding pattern. Thus, the magnetic field is lengthened in a direction substantially perpendicular to the plane of the patterns so as to efficiently transmit a high-frequency signal over a short distance, and, thus, the high-frequency coupler and the communication device can be effectively used to communicate a large volume of data over a short distance. In addition, since the transmission of energy is performed by magnetic coupling, the decrease in energy is proportional to the square of the distance and therefore small as compared to electric field coupling in which the energy decreases in proportion to the cube of the distance. Moreover, since neither a parallel inductor nor a ground electrode, which are necessary in electric field coupling, are required, the size of high-frequency coupler and the communication device can be reduced accordingly.

Furthermore, in the high-frequency coupler and the communication device, a magnetic-field antenna pattern may be further provided and it is preferable that the magnetic-field-generating pattern and the surrounding pattern be arranged inside the magnetic-field antenna pattern, and in particular, in a central portion of the magnetic-field antenna pattern. At the same time that a large volume of data is communicated using the magnetic-field-generating pattern, communication can also be performed with a non-contact IC card system in which the magnetic-field antenna pattern is used.

With various preferred embodiments of the present invention, a coupler can be reduced in size and the coupler can efficiently transmit a high-frequency signal over a short distance, and in particular, can be suitably used to communicate a large volume of data over a short distance. Furthermore, communication can be performed using a non-contact IC card system in which the magnetic-field antenna pattern is used, in parallel with communication of a large volume of data using the magnetic-field-generating pattern.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A illustrates the case in which the magnetic fields are in phase with each other and FIG. 2B illustrates the case in which the magnetic fields are out of phase with each other.

FIG. 4A is a plan view and FIG. 4B is a back surface view.

FIG. 8A is a plan view of a first layer, FIG. 8B is plan view of a second layer, and FIG. 8C is a back surface view of a third layer.

DETAILED DESCRIPTION OF THE PREFERRED EMBODIMENTS

Hereafter, high-frequency couplers and communication devices according to preferred embodiments of the present invention will be described with reference to the drawings. In each of the drawings, common components and elements are denoted by the same symbols and repeated description thereof is omitted.

Figure 1A:
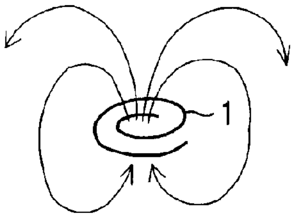
FIG. 1A is an explanatory diagram illustrating a state in which a magnetic field is generated by a single magnetic-field-generating pattern.
Figure 1B:
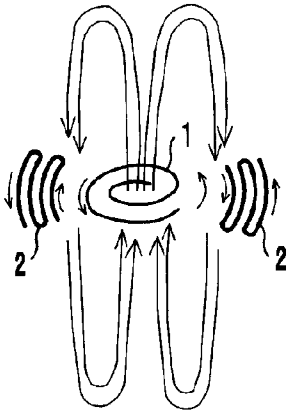
FIG. 1B is an explanatory diagram illustrating the state of magnetic field generation in the case where a surrounding pattern is arranged around the periphery of the magnetic-field-generating pattern.

As illustrated in FIG. 1A, a magnetic field is generated radially from a coil-shaped magnetic-field-generating pattern 1 by a current flowing therethrough. This magnetic field extends laterally in a plane of the magnetic-field-generating pattern 1. Accordingly, in a high-frequency coupler according to a preferred embodiment of the present invention, as illustrated in FIG. 1B, a surrounding pattern 2 that zigzags back and forth is preferably arranged around the periphery of the magnetic-field-generating pattern 1. Due to the current flowing through the surrounding pattern 2, the portion of the magnetic field extending laterally in the plane of the patterns out of the magnetic field radiated from the magnetic-field-generating pattern 1 is blocked. Thus, the magnetic field is lengthened in certain directions that are substantially perpendicular to the plane of the patterns. As a result, the directionality thereof is set, there is no interference with other communication devices, transmission of a high-frequency signal can be efficiently performed over a short distance, and in particular, the magnetic field can be suitably used to communicate a large volume of data over a short distance in, for example, a communication system in which broadband frequencies are used.

A magnetic field is radiated from the magnetic-field-generating pattern 1 but, since the magnetic-field-generating pattern 1 itself does not resonate at the communication frequency, the magnetic field is radiated over a broad frequency band. The communication distance can preferably be increased by increasing the number of turns or the area of the magnetic-field-generating pattern 1.

As illustrated in FIG. 1B, it is preferable that the surrounding pattern 2 be arranged close to the magnetic-field-generating pattern 1 and that adjacent portions of the magnetic-field-generating pattern 1 and the surrounding pattern 2 wind in opposite directions. Currents flow in opposite directions through the adjacent portions of magnetic-field-generating pattern 1 and the surrounding pattern 2, whereby magnetic fields are generated in different directions and the magnetic-field-blocking effect is improved. Furthermore, it is preferable that the surrounding pattern 2 wind through a plurality of turns and that adjacent portions of the surrounding pattern 2 wind in opposite directions. Currents flow through the adjacent portions of the surrounding pattern 2 in opposite directions, the adjacent portions of the surrounding pattern 2 generate magnetic fields in different directions, and these magnetic fields cancel each other out. Thus, overall, no magnetic field is generated in the region in which the magnetic field of the surrounding pattern 2 is provided. As a result, the magnetic field radiated from the magnetic-field-generating pattern 1 is blocked by the surrounding pattern 2, which includes a plurality of turns and does not generate a magnetic field overall. That is to say, the magnetic field radiated from the magnetic-field-generating pattern 1 can be effectively blocked by the surrounding pattern 2, which includes a plurality of turns.

If the distance between the magnetic-field-generating pattern 1 and the surrounding pattern 2 is relatively small, the surrounding pattern 2 must have a large number of turns and a strong effect of laterally blocking the magnetic field is provided. In contrast, if the distance between the magnetic-field-generating pattern 1 and the surrounding pattern 2 is relatively long, the surrounding pattern 2 may preferably include a small number of turns and the magnetic field will also extend in diagonal directions, not only in directions perpendicular or substantially perpendicular to the plane of the patterns. Therefore, the angle at which the magnetic field is radiated can preferably be controlled by adjusting the distance between the magnetic-field-generating pattern 1 and the surrounding pattern 2.

If the surrounding pattern 2 is arranged close to the magnetic-field-generating pattern 1, the patterns are magnetically coupled such that the inductance value of the magnetic-field-generating pattern 1 is decreased. For this reason, in order to obtain a desired inductance value, it is necessary to increase the inductance value of the magnetic-field-generating pattern

1. For example, by increasing the number of turns or the area of the magnetic-field-generating pattern 1, radiation of the magnetic field can be greatly lengthened in directions perpendicular or substantially perpendicular to the plane of the patterns and the communication distance can be increased.

Figure 1C:
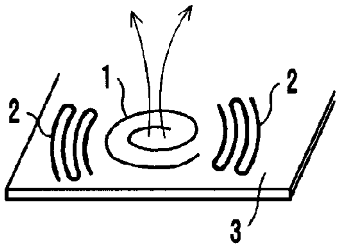
FIG. 1C is an explanatory diagram illustrating the state of magnetic field generation in the case in which a magnetic sheet has been provided.

As illustrated in FIG. 1C, a magnetic sheet 3 may preferably be provided on one side in the directions in which the magnetic field is generated by the magnetic-field-generating pattern 1. The magnetic sheet 3 is preferably, for example, made of a ferrite. The magnetic field radiates from the magnetic-field-generating pattern 1 in both directions perpendicular or substantially perpendicular to the plane of the patterns. Since the magnetic field is absorbed in one direction by the magnetic sheet 3, the magnetic field is only radiated in the other direction and the transmission efficiency of high-frequency signals is improved. Furthermore, even if a metal material or other similar material is arranged on the magnetic sheet 3 side of the coupler, the influence therefrom on the high-frequency coupler is very small. It is preferable that the magnetic sheet 3 be superposed with the magnetic-field-generating pattern 1 when viewed in plan and with the surrounding pattern 2 when viewed in plan.

Figure 2A:
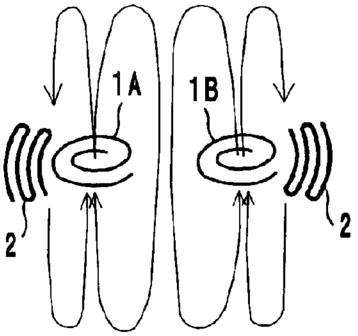
FIGS. 2A and 2B are explanatory diagrams illustrating the state of magnetic field generation in the case in which two magnetic-field-generating patterns have been provided, where
Figure 2B:
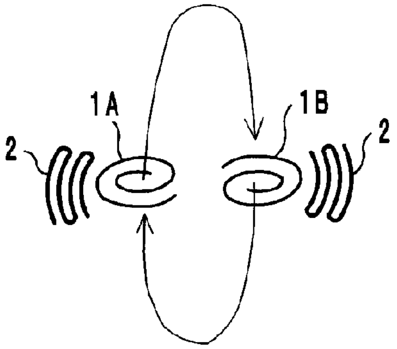

As illustrated in FIGS. 2A and 2B, the magnetic-field-generating pattern may preferably include two winding patterns 1A and 1B. In this case, the two patterns 1A and 1B may be wound in the same direction (refer to FIG. 2A, magnetic fields in phase) or may be wound in opposite directions (refer to FIG. 2B, magnetic fields out of phase). In either case, the magnetic fields are generated in the same direction and a magnetic field can be efficiently generated in a certain direction.

Figure 3:
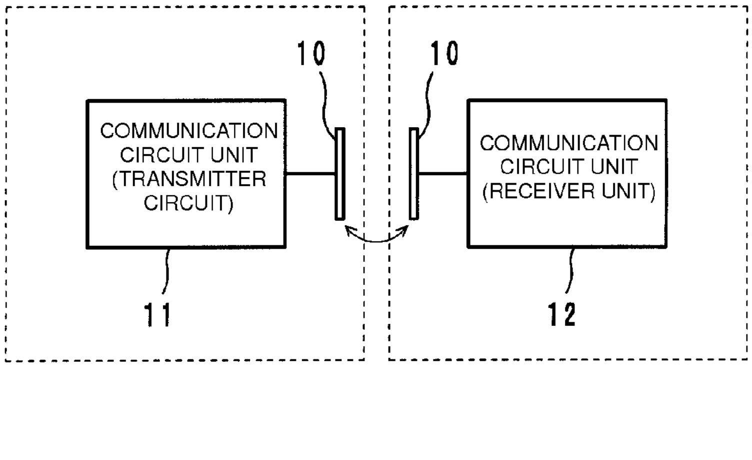
FIG. 3 is a block diagram illustrating structures of communication devices according to a preferred embodiment of the present invention.

In communication devices according to a preferred embodiment of the present invention, as illustrated in FIG. 3, high-frequency couplers 10, each preferably including the magnetic-field-generating pattern 1 and the surrounding pattern 2, are connected to communication circuit units (transmitter circuit 11, receiver circuit 12) and transmission and reception of a large volume of data in a short time is possible by using a communication system in which broadband signals having a high frequency of 1 GHz or higher are used by arranging the high-frequency coupler 10 that is connected to the receiver circuit 12 within about 30 mm of the high-frequency coupler 10 that is connected to the transmitter circuit 11.

First Preferred Embodiment

Figure 4A:
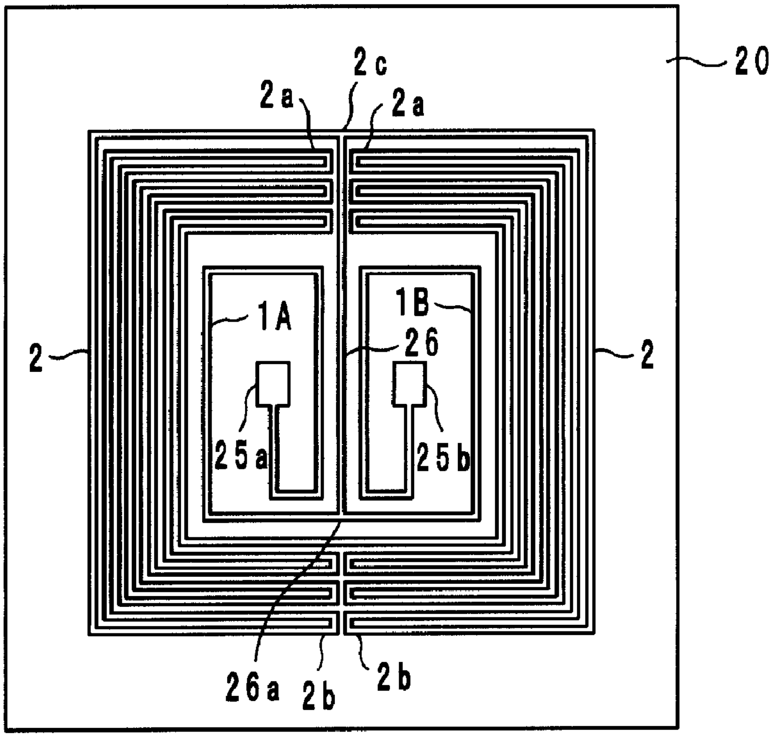
FIGS. 4A and 4B illustrate a high-frequency coupler according to a first preferred embodiment of the present invention, where
Figure 4B:
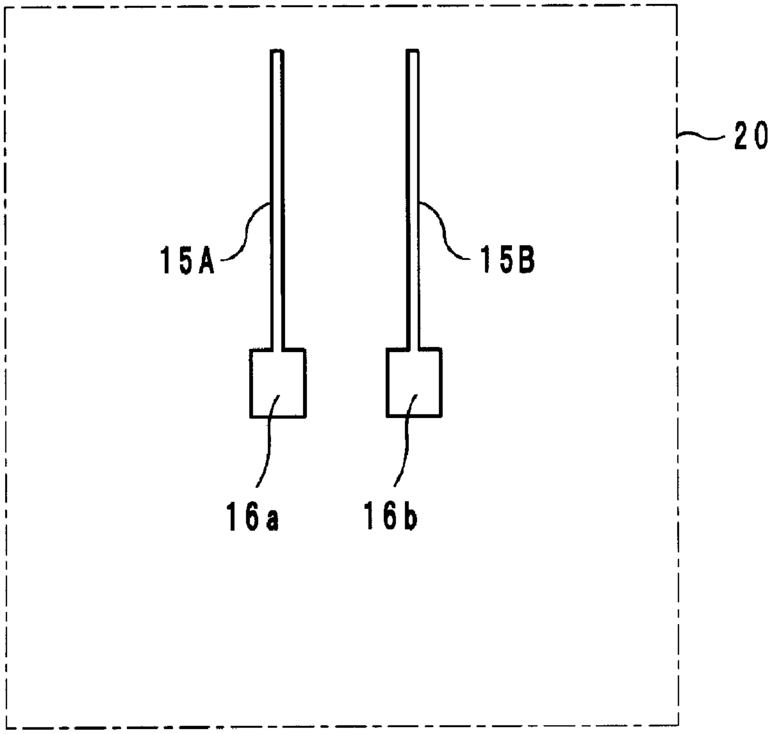

In a high-frequency coupler according to a first preferred embodiment of the present invention, as illustrated in FIGS. 4A and 4B, preferably, the magnetic-field-generating patterns 1A and 1B are arranged so as to be close to each other on the front surface of a sheet 20, which is preferably made of a resin, for example, the surrounding pattern 2 is arranged around the periphery of the magnetic-field-generating patterns 1A and 1B, and electrodes 15A and 15B are arranged on the back surface of the sheet 20. The patterns 1A, 1B and 2 and the electrodes 15A and 15B are formed preferably by attaching a thin metal plate, which is preferably made of a conductive material, such as aluminum foil or copper foil, for example, to the sheet 20 and then subjecting the thin metal plate to patterning or by applying a conductive paste such as Al, Cu, or Ag, for example, onto the sheet 20 and subjecting the film provided by plate processing to patterning.

Electrode portions 25*a* and 25*b* are provided at an end of each of the magnetic-field-generating patterns 1A and 1B and the other ends thereof are connected to a line 26 (connection point 26*a*). The surrounding pattern 2 winds back and forth in opposite directions for a plurality of turns via folded-back portions 2*a* and 2*b*. The other end of the line 26 is electrically connected to the surrounding portion 2 through a central portion 2*c*, which is at the approximate center of the surrounding pattern 2 in the length direction thereof. The electrode portions 25*a* and 25*b* oppose electrode portions 16*a* and 16*b* of the electrodes 15A and 15B provided on the back surface of the sheet 20 and capacitors are thus defined therebetween. The magnetic-field-generating patterns 1A and 1B are capacitively coupled through the electrode portions 25*a* and 16*a* and 25*b* and 16*b*, respectively. In addition, an end of the electrode 15A or 15B is electrically connected to a communication circuit unit, such as the transmitter circuit 11 or the receiver circuit 12.

In addition, the end that is not electrically connected to a communication circuit unit (transmitter circuit 11 or receiver circuit 12) is an open end. For example, if the end of the electrode 15B is not connected to a communication circuit unit and functions as an open end, the end of the electrode 15B functions as a leading end of the magnetic-field-generating pattern 1B. Furthermore, at the end of the electrode 15B, an electrostatic capacitance is generated by the electrode portion 16*b* and the electrode portion 25*b*, and the end of the electrode 15B is connected to the center portion 2*c* of the surrounding pattern 2. Here, the central portion 2*c* of the surrounding pattern 2 is preferably a portion at which voltage is minimum and functions as a virtual ground in circuit terminology and, therefore, an electrostatic capacitance is generated between the electrode 15B and the ground.

The capacitors defined between the electrode portions 16*a* and 16*b* and the electrode portions 25*a* and 25*b* preferably provide impedance matching between the communication circuit unit and the magnetic-field-generating patterns 1A and 1B.

The fundamental operational advantages of the first preferred embodiment have been described above with reference to FIGS. 1A to 1C and FIGS. 2A and 2B. These operational advantages are that portions of the magnetic fields, which are radiated from the magnetic-field-generating patterns 1A and 1B, that extend laterally in the plane of the patterns are blocked by the surrounding pattern 2, the magnetic fields are lengthened in certain directions perpendicular or substantially perpendicular to the plane of the patterns, and it is possible to efficiently transmit high-frequency signals over a short distance on the order of about 30 mm, for example. In particular, in the first preferred embodiment, the magnetic-field-generating patterns 1A and 1B are preferably wound in the same direction. Thus, magnetic fields in the same direction are combined and the communication distance is improved.

Furthermore, in the first preferred embodiment, the surrounding pattern 2 is preferably defined by a folded dipole antenna, for example. A broad passband can be obtained with a dipole antenna. In the case in which the surrounding pattern 2 is a dipole antenna, it is preferable that the length of the surrounding pattern 2 be an integer multiple of $\lambda/2$ ($\lambda$: predetermined frequency). The surrounding pattern 2 resonates and, therefore, the transmission efficiency of energy is improved. In addition, the magnetic-field-generating patterns 1A and 1B and the surrounding pattern 2 are electrically connected to one another preferably through the central portion 2*c*, which is at the approximate center of the surrounding pattern 2 in the length direction thereof and, therefore, the transmission efficiency of signals is maximized. In other words, within the passband of the surrounding pattern 2, currents flow through the magnetic-field-generating patterns 1A and 1B and magnetic fields are generated. The current is maximum and the voltage is minimum at the central portion 2*c*, and because the point at which the current is maximum is where the strength of the magnetic field generated by the current is maximum, the efficiency of transmission of a signal is also maximum at this point.

The surrounding pattern 2 preferably also functions as an electric-field antenna. If the resonant frequency of the surrounding pattern 2 is set to match the frequency used in a communication system in which broadband frequencies are used, a broadband resonator is provided. The magnetic-field-generating patterns 1A and 1B generate magnetic fields within the pass frequency band of the surrounding pattern 2 (electric-field antenna), due to the magnetic-field-generating patterns 1A and 1B and the surrounding pattern 2 being coupled with each other at the central portion 2*c*. When the surrounding pattern 2 is a dipole antenna, a bandwidth of about 500 MHz and greater can be obtained and the same bandwidth can be obtained even when the surrounding pattern 2 is a folded dipole antenna as in the first preferred embodiment.

Furthermore, the high-frequency coupler according to the first preferred embodiment preferably includes only the patterns 1A, 1B and 2 and the electrodes 15A and 15B on the front and back surfaces of the sheet 20, the thickness thereof is only about 0.15 mm to about 0.6 mm, for example, the area thereof is the size of the surrounding pattern 2 and includes four sides of about 5 mm to about 7 mm, for example, and is therefore very small.

Second Preferred Embodiment

Figure 5:
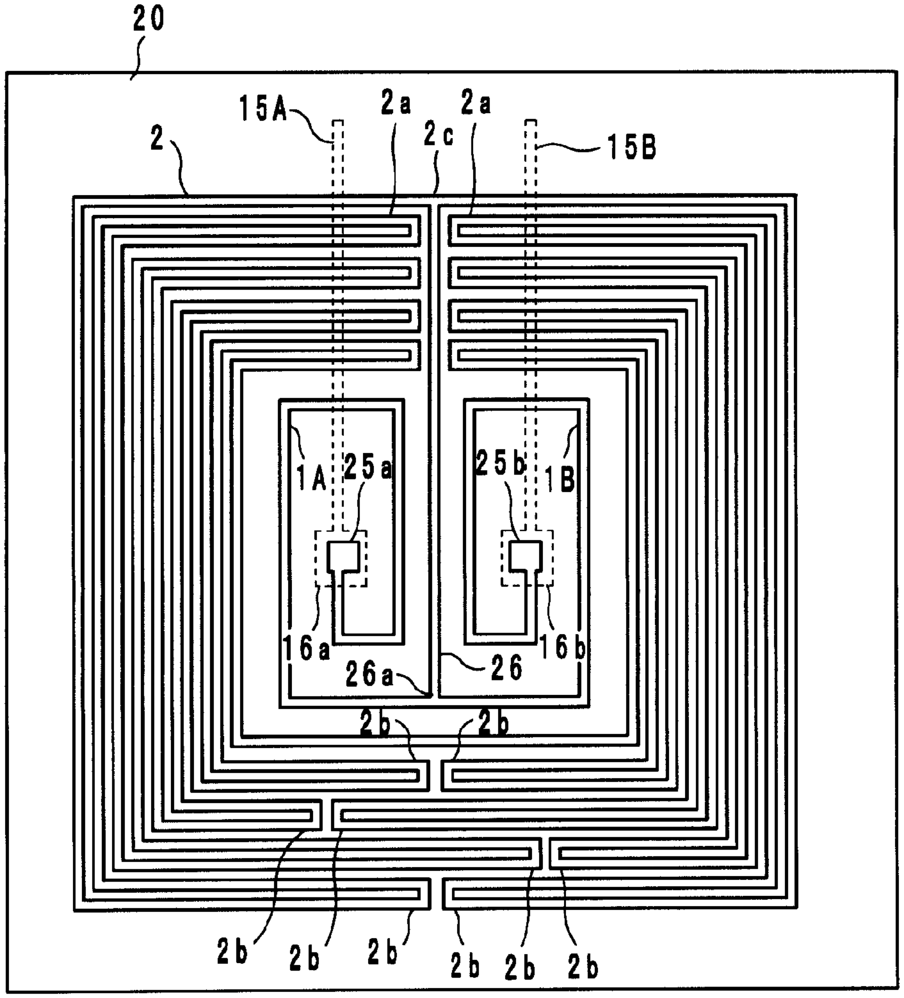
FIG. 5 is a plan view illustrating a high-frequency coupler according to a second preferred embodiment of the present invention.

A high-frequency coupler according to a second preferred embodiment of the present invention, as illustrated in FIG. 5, has substantially the same structure as that of the first preferred embodiment. In the second preferred embodiment, the folded-back portions 2*b* of the surrounding pattern 2 are preferably arranged at different surrounding positions when viewed in plan. The path along which the magnetic fields radiated from the magnetic-field-generating patterns 1A and 1B pass in lateral directions is relatively short and the magnetic fields are blocked with more certainty. Other operational advantages are substantially the same as those of the first preferred embodiment.

Third Preferred Embodiment

Figure 6:
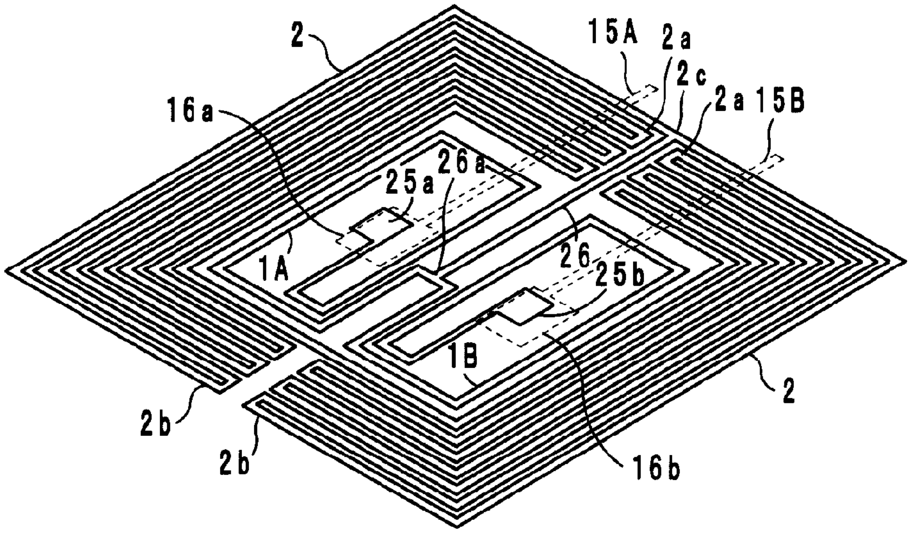
FIG. 6 is a perspective view illustrating a high-frequency coupler according to a third preferred embodiment of the present invention.

A high-frequency coupler according to a third preferred embodiment of the present invention, as illustrated in FIG. 6, has substantially the same structure as that of the first preferred embodiment. In the third preferred embodiment, the connection point 26*a* between the magnetic-field-generating patterns 1A and 1B and the line 26 is preferably disposed between the magnetic-field-generating patterns 1A and 1B. The degree of magnetic coupling between the magnetic-field-generating patterns 1A and 1B changes in accordance with the position of the connection point 26*a*, whereby the reflection characteristics at high frequencies can be effectively controlled. When the connection point 26*a* is positioned between the magnetic-field-generating patterns 1A and 1B, as in the third preferred embodiment, the passband is narrowed. The other operational advantages are substantially the same as those of the first preferred embodiment.

Fourth Preferred Embodiment

Figure 7:
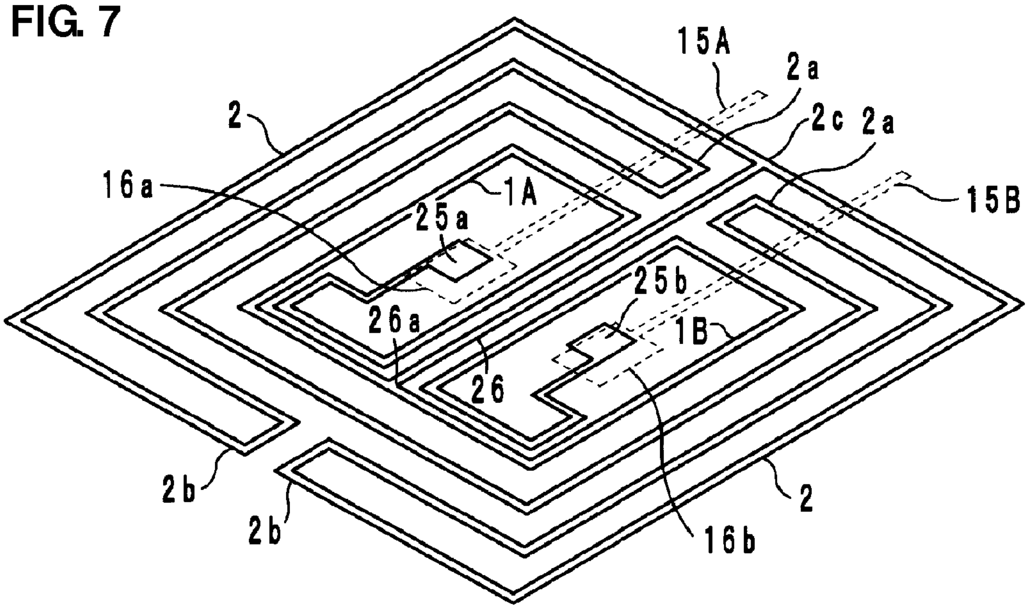
FIG. 7 is a perspective view illustrating a high-frequency coupler according to a fourth preferred embodiment of the present invention.

A high-frequency coupler according to a fourth preferred embodiment of the present invention, as illustrated in FIG. 7, has a structure that is substantially the same as that of the first preferred embodiment. In the fourth preferred embodiment, the number of turns of the surrounding pattern 2 is preferably relatively small. The operational advantages are substantially the same as those of the first preferred embodiment. However, the surrounding pattern 2 includes a shorter line length than in the first preferred embodiment, which is not λ/2, and is not a dipole antenna.

Fifth Preferred Embodiment

Figure 8A:
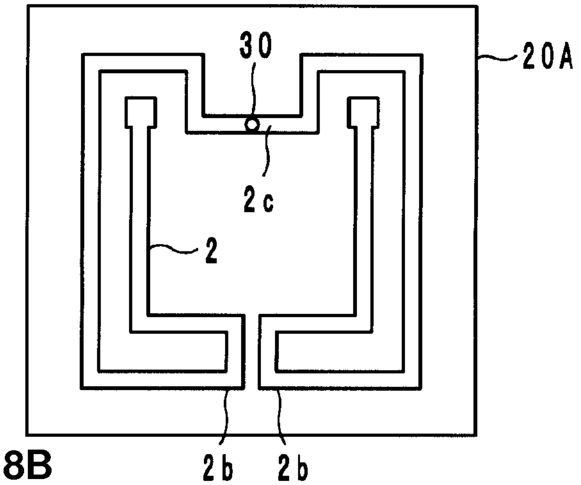
FIGS. 8A to 8C illustrate a high-frequency coupler according to a fifth preferred embodiment of the present invention, where
Figure 8B:
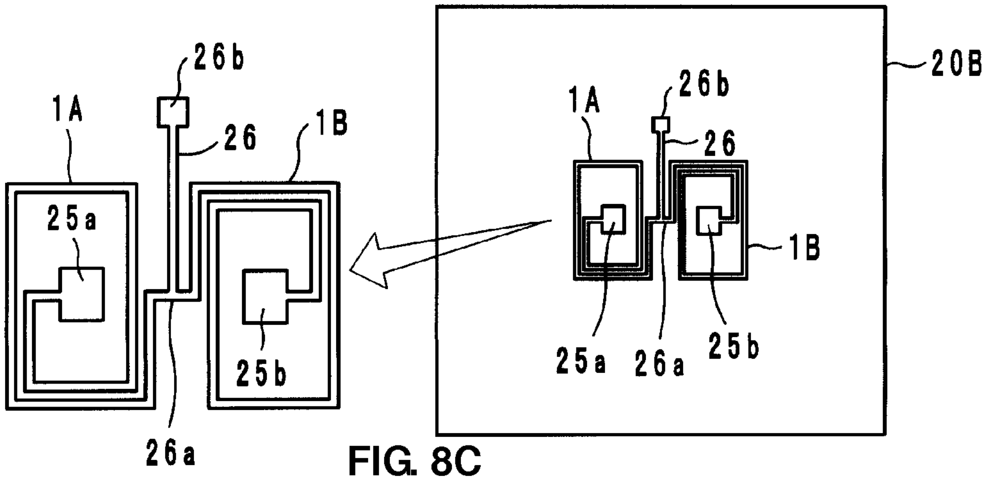
Figure 8C:
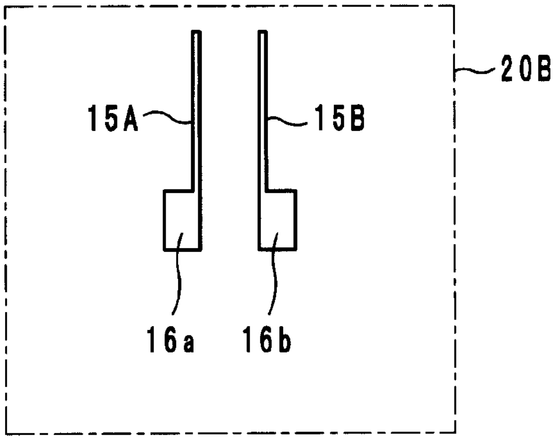

A high-frequency coupler according to a fifth preferred embodiment of the present invention, as illustrated in FIG. 8A to 8C, preferably includes a multilayer structure in which the surrounding pattern 2 is provided on the front surface of a resin sheet 20A, the magnetic-field-generating patterns 1A and 1B are provided on the front surface of a resin sheet 20B positioned below the resin sheet 20A, and the electrodes 15A and 15B are provided on the back surface of the resin sheet 20B.

An end 26*b* of the line 26 connected to the magnetic-field-generating patterns 1A and 1B and the central portion 2*c* of the surrounding pattern 2 are connected to each other preferably through a via hole conductor 30. Furthermore, the surrounding pattern 2 is preferably a dipole antenna with two open ends. The operational advantages of the fifth preferred embodiment are substantially the same as those of each of the first to fourth preferred embodiments. In particular, the magnetic-field-generating patterns 1A and 1B are preferably wound in opposite directions in the fifth preferred embodiment. The magnetic fields in different directions cancel each other out and a single magnetic loop is provided. Thus, since the portion of the magnetic field radiated laterally in the plane of the patterns is relatively small, the number of turns of the surrounding pattern 2 can be reduced.

Sixth Preferred Embodiment

Figure 9:
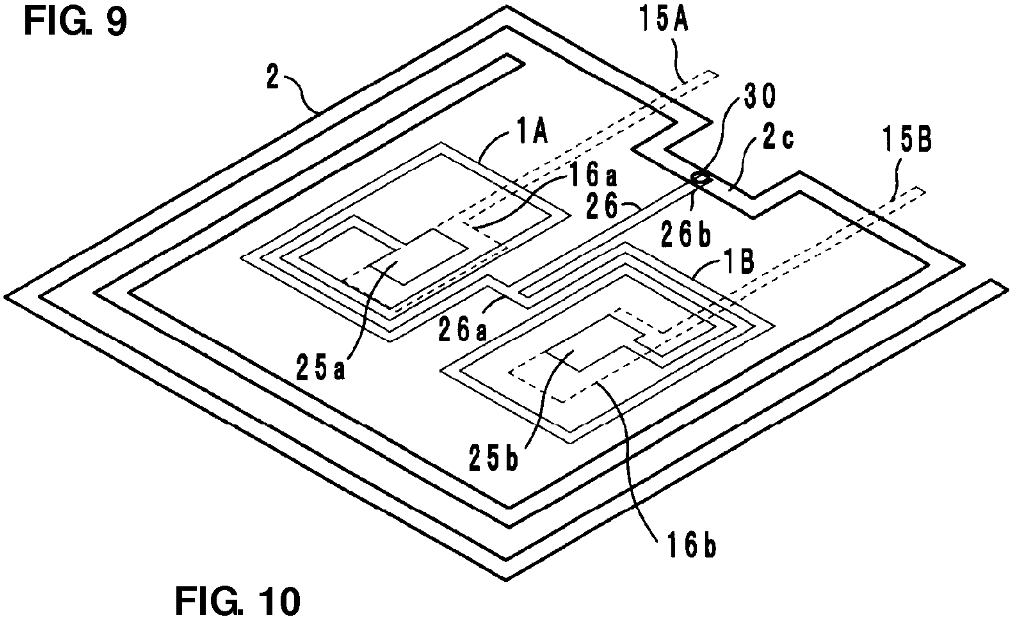
FIG. 9 is a perspective view illustrating a high-frequency coupler according to a sixth preferred embodiment of the present invention.

A high-frequency coupler according to a sixth preferred embodiment of the present invention, as illustrated in FIG. 9, preferably includes a multilayer structure similarly to that of the fifth preferred embodiment, and the surrounding pattern 2 is provided in a first layer, the magnetic-field-generating patterns 1A and 1B are provided in a second layer, and the electrodes 15A and 15B are provided in a third layer. Illustration of the resin sheets is omitted from FIG. 9.

The surrounding pattern 2 is connected to the line 26 preferably through the via hole conductor 30 and is a dipole antenna including two open ends. The operational advantages of the sixth preferred embodiment are substantially the same as those of each of the first to fifth preferred embodiments.

Seventh Preferred Embodiment

Figure 10:
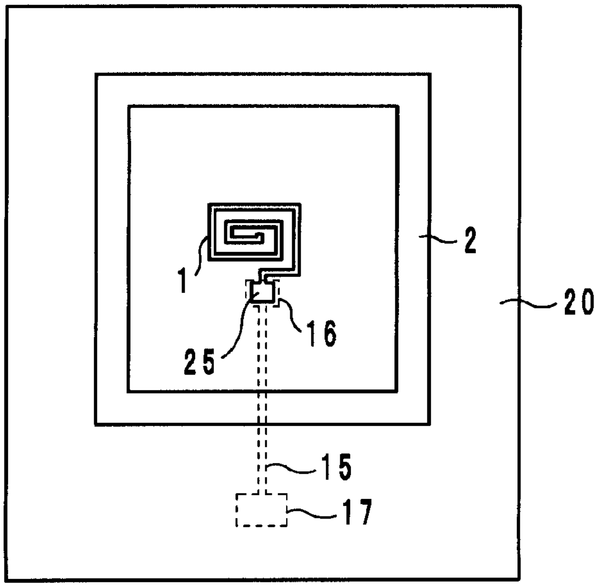
FIG. 10 is a plan view illustrating a high-frequency coupler according to a seventh preferred embodiment of the present invention.

In a high-frequency coupler according to a seventh preferred embodiment of the present invention, as illustrated in FIG. 10, preferably, the magnetic-field-generating pattern 1 is arranged in substantially the center of the front surface of the resin sheet 20, the surrounding pattern 2 is arranged so as to surround the periphery thereof, and an electrode portion 25 provided at one end of the magnetic-field-generating pattern 1 opposes an electrode portion 16 of the electrode 15 arranged on the back surface of the sheet 20, thereby defining a capacitor. An electrode portion 17 provided at the other end of the electrode 15 is electrically connected to a communication circuit unit.

In the seventh preferred embodiment, the surrounding pattern 2 preferably includes a ground electrode and blocks the portion of the magnetic field laterally radiated in the plane of the patterns from the magnetic-field-generating pattern 1, and the magnetic field is lengthened in directions perpendicular or substantially perpendicular to the plane of the patterns. Therefore, the operational advantages of the seventh preferred embodiment are substantially the same as those of the first preferred embodiment.

Eighth Preferred Embodiment

Figure 11:
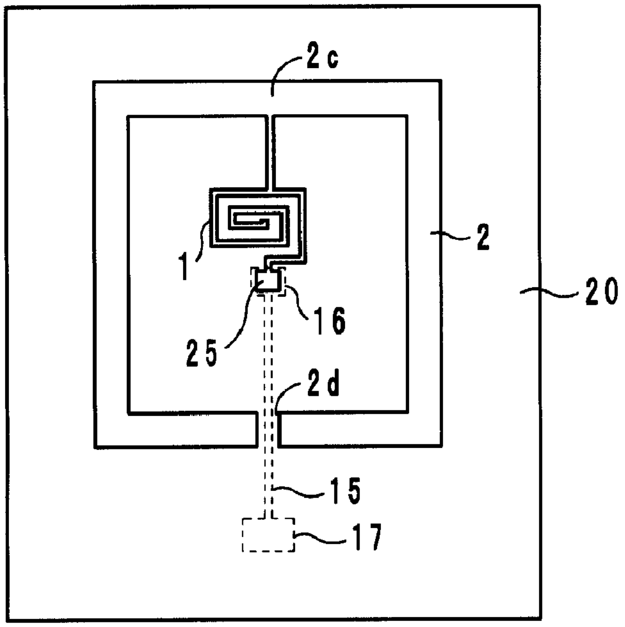
FIG. 11 is a plan view illustrating a high-frequency coupler according to an eighth preferred embodiment of the present invention.

In a high-frequency coupler according to an eighth preferred embodiment, as illustrated in FIG. 11, the magnetic-field-generating pattern 1 of the seventh preferred embodiment is connected to the center portion 2*c* of the surrounding pattern 2. In the case where the magnetic-field-generating pattern 1 is connected to the surrounding pattern 2, it is preferable to form a cut-out portion 2*d* in the surrounding pattern 2 so that current loss does not occur. The operational advantages of the eighth preferred embodiment are the same as those of the seventh preferred embodiment.

Ninth Preferred Embodiment

Figure 12:
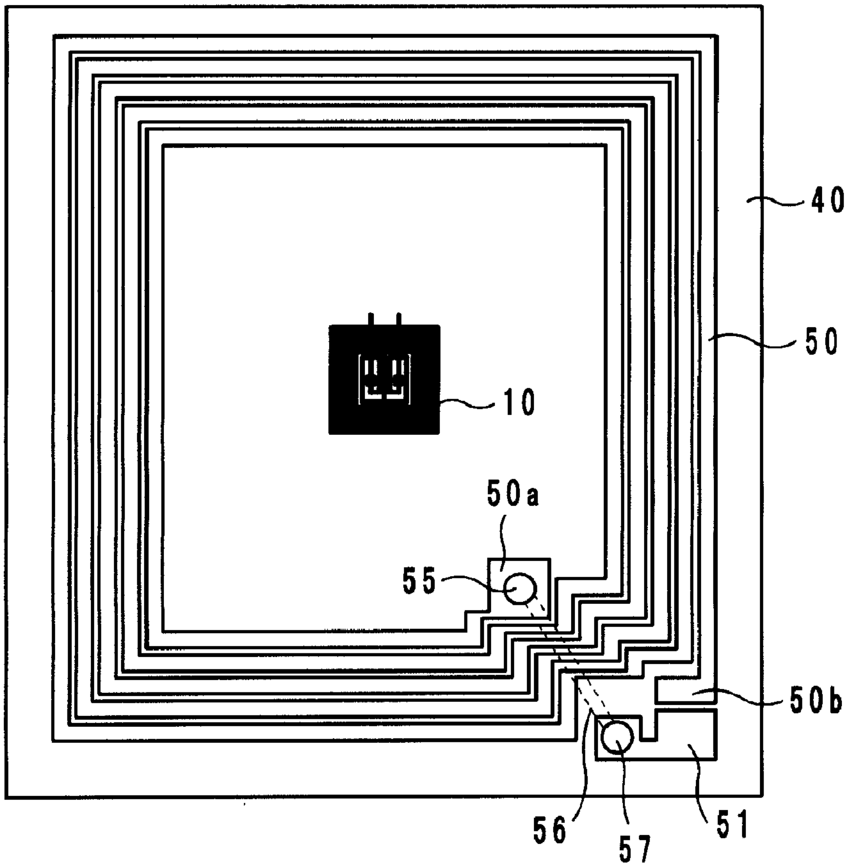
FIG. 12 is a plan view illustrating a high-frequency coupler according to a ninth preferred embodiment of the present invention.

In a high-frequency coupler according to a ninth preferred embodiment, as illustrated in FIG. 12, a magnetic-field antenna pattern 50 is provided on the front surface of a resin sheet 40 and a high-frequency coupler 10 (for example, the high-frequency coupler according to the second preferred embodiment) including a magnetic-field-generating pattern and a surrounding pattern is arranged inside the pattern 50 (preferably in the center portion). The magnetic-field antenna pattern 50 loops in a loop-shaped arrangement and an end 50*a* thereof is connected to an end of a line electrode 56 provided on the back surface of the sheet 40 through a via-hole conductor 55 and another end of the line electrode 56 is connected to an electrode 51 provided on the front surface of the sheet 40 through a via-hole conductor 57. The other end 50*b* of the magnetic-field antenna pattern 50 and the electrode 51, which are adjacent to each other, are connected to a communication circuit unit of a non-contact IC card system (not illustrated). Thus, the magnetic-field antenna pattern 50 functions as a communication antenna in a non-contact IC card system. The resonant frequency of the magnetic-field antenna pattern 50 is lower than the communication frequency of the magnetic-field-generating pattern and corresponds to 13.56 MHz, which is the communication frequency used in the non-contact-type IC card system.

In addition, a conventional known wireless IC may be mounted on the other end 50*b* of the magnetic-field antenna pattern 50 and the electrode 51, which are adjacent to each other.

In the ninth preferred embodiment, both communication in which broadband frequencies are used employing the magnetic-field-generating pattern and communication using the non-contact IC card system employing the magnetic-field antenna pattern 50 can be implemented together. For example, a large volume of data such as images or music can be received at the same time as making a financial transaction, at a convenience store or the like.

The magnetic-field antenna pattern 50 preferably includes a comparatively large loop and therefore, provided that the magnetic-field-generating pattern and the surrounding pattern are arranged thereinside, the patterns can be combined so as to be made compact. In conventional couplers of an electric-field coupling system, since a ground electrode is necessary, the combined use of the magnetic-field antenna pattern 50 is not possible.

It is preferable to arrange the magnetic-field-generating pattern in the central portion of the magnetic-field antenna pattern 50. The magnetic-field-generating pattern is of very small size and it is difficult to match its position with that of the other antenna. However, it is easy to match the position of the magnetic-field antenna pattern 50, which is a comparatively large loop, with that of the other antenna at the time of communication, and thereby the position of the magnetic-field-generating pattern also comes to accurately match that of the other pattern. For example, provided that a mark or the like is made such that the central portion of the magnetic-field antenna pattern 50 can be recognized from the exterior, position matching for the magnetic-field-generating pattern can also be accurately performed by performing position matching using the mark or the like.

Figure 13:
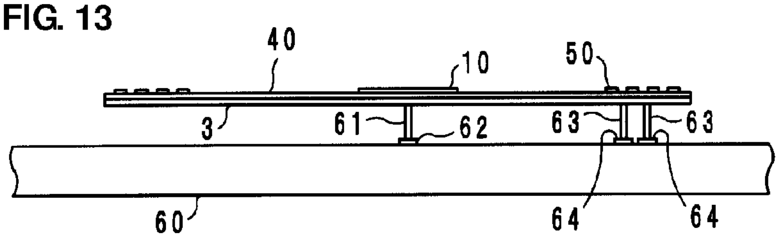
FIG. 13 is a front view illustrating a state in which the high-frequency coupler according to the ninth preferred embodiment of the present invention is mounted on a printed wiring circuit board.

In FIG. 13, a connection state between the high-frequency coupler and a communication circuit unit mounted on a printed wiring circuit board 60 built into a communication device such as a mobile telephone device is illustrated. The electrode portion 16*a* (refer to FIG. 4) of the high-frequency coupler 10 is electrically connected to a communication circuit unit of a communication system in which broadband frequencies are used, through a connection pin 61 and a land 62. Furthermore, the magnetic-field antenna pattern 50 is electrically connected to a communication circuit unit of a non-contact-IC-card system through a connection pin 63 and a land 64. As the connection pin 61 of the high-frequency coupler 10, it is not necessary to use an expensive pin for high-frequencies and instead an inexpensive pin for low frequencies the same as the pin 63 can be used.

The symbol 3 in FIG. 13 denotes an approximately 500-μm-thick magnetic sheet, and the magnetic sheet 3 is superposed with the high-frequency coupler 10, which includes the magnetic-field-generating pattern and the surrounding pattern, and the magnetic-field antenna pattern 50 when viewed in plan. The operational advantages thereby achieved have been explained with reference to FIG. 1C. More specifically, the magnetic field is radiated in both directions that are perpendicular or substantially perpendicular to the plane of the patterns. One of the directions of the magnetic field is absorbed and only the magnetic field in the other direction is radiated due to this structure. And therefore, the influence thereon of metal components such as batteries built into the mobile telephone device can be eliminated.

Tenth Preferred Embodiment

Figure 14:
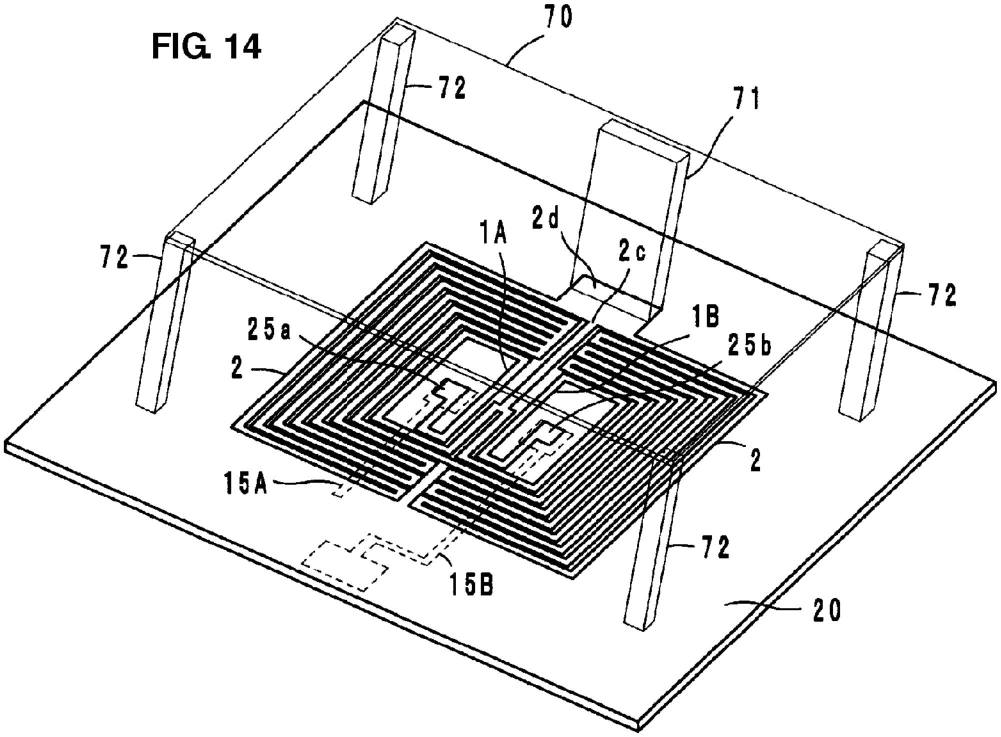
FIG. 14 is a perspective view illustrating a high-frequency coupler according to a tenth preferred embodiment of the present invention.

A high-frequency coupler according to a tenth preferred embodiment, as illustrated in FIG. 14, has substantially the same structure as that of the third preferred embodiment (refer to FIG. 6) in which the magnetic-field-generating patterns 1A and 1B are arranged close to each other on the front surface of the sheet 20, the surrounding pattern 2 is arranged around the periphery of the magnetic-field-generating patterns 1A and 1B, and further the electrodes 15A and 15B are arranged on the back surface of the sheet 20. In the tenth preferred embodiment, a connection portion 2*d* is further provided in the center portion 2*c* of the surrounding pattern 2 in the center in the length direction thereof and a metal plate 70 is electrically connected to the connection portion 2*d* through a columnar portion 71. The metal plate 70 is arranged on the sheet 20 through supporting columns 72 at the four corners thereof so as to cover the magnetic-field-generating patterns 1A and 1B and the surrounding pattern 2.

In the tenth preferred embodiment, since the metal plate 70 is electrically connected to the center portion 2*c* of the surrounding pattern 2, electric fields can be transmitted and received over a broad band and energy transmission efficiency can be improved.

Other Preferred Embodiments

High-frequency couplers and communication devices according to the present invention are not limited to those of the above-described preferred embodiments and of course can be modified in various ways within the scope of the gist thereof.

As has been described above, various preferred embodiments of the present invention are preferably for use in high-frequency couplers and communication devices and in particular are excellent in terms of being compact and being capable of efficiently communicating a large volume of data over a short distance.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency coupler comprising:

a magnetic-field-generating pattern that generates a magnetic field in a certain direction; and a surrounding pattern that is arranged around a periphery of the magnetic-field-generating pattern and that blocks a portion of the magnetic field generated by the magnetic-field-generating pattern, the portion of the magnetic field extending laterally in a plane that includes the magnetic-field-generating pattern and the surrounding pattern; wherein the surrounding pattern loops through a plurality of turns and adjacent portions of the surrounding pattern loop in opposite directions.

2. The high-frequency coupler according to claim 1, wherein the surrounding pattern is arranged close to the magnetic-field-generating pattern and adjacent portions of the magnetic-field-generating pattern and the surrounding pattern loop in opposite directions.

3. The high-frequency coupler according to claim 1, wherein the surrounding pattern loops back and forth through a plurality of turns via folded back portions and the folded back portions are arranged at different surrounding positions when viewed in plan.

4. The high-frequency coupler according to claim 1, wherein the magnetic-field-generating pattern and the surrounding pattern are electrically connected to each other through a length-direction center portion of the surrounding pattern.

5. The high-frequency coupler according to claim 1, wherein a metal plate is electrically connected to a length-direction center portion of the surrounding pattern.

6. The high-frequency coupler according to claim 1, wherein the surrounding pattern includes a dipole antenna.

7. The high-frequency coupler according to claim 1, wherein the magnetic-field-generating pattern includes at least two looping patterns.

8. The high-frequency coupler according to claim 7, wherein the at least two looping patterns loop in the same direction.

9. The high-frequency coupler according to claim 7, wherein the at least two looping patterns loop in opposite directions.

10. The high-frequency coupler according to claim 1, wherein a communication signal is a high-frequency signal of 1 GHz or higher.

11. The high-frequency coupler according to claim 1, further comprising a magnetic-field antenna pattern, wherein the magnetic-field-generating pattern and the surrounding pattern are arranged inside the magnetic-field antenna pattern.

12. The high-frequency coupler according to claim 11, wherein a resonant frequency of the magnetic-field antenna pattern is lower than a communication frequency of the magnetic-field-generating pattern.

13. The high-frequency coupler according to claim 11, wherein the magnetic-field-generating pattern is arranged in a center portion of the magnetic-field antenna pattern.

14. The high-frequency coupler according to claim 11, wherein a magnetic member is provided on one side in a direction in which the magnetic field is generated by the magnetic-field-generating pattern and the magnetic member is superposed with the magnetic-field-generating pattern and the magnetic-field antenna pattern when viewed in plan.

15. A high-frequency coupler comprising:

a magnetic-field-generating pattern that generates a magnetic field in a certain direction; and a surrounding pattern that is arranged around a periphery of the magnetic-field-generating pattern and that blocks a portion of the magnetic field generated by the magnetic-field-generating pattern, the portion of the magnetic field extending laterally in a plane that includes the magnetic-field-generating pattern and the surrounding pattern; wherein a length of the surrounding pattern is equal to an integer multiple of $\lambda/2$, where $\lambda$ is a predetermined frequency.

16. A high-frequency coupler comprising:

a magnetic-field-generating pattern that generates a magnetic field in a certain direction; and a surrounding pattern that is arranged around a periphery of the magnetic-field-generating pattern and that blocks a portion of the magnetic field generated by the magnetic-field-generating pattern, the portion of the magnetic field extending laterally in a plane that includes the magnetic-field-generating pattern and the surrounding pattern; wherein a magnetic member is provided on one side in a direction in which the magnetic field is generated by the magnetic-field-generating pattern.

17. The high-frequency coupler according to claim 16, wherein the magnetic member is superposed with the magnetic-field-generating pattern when viewed in plan.

18. A high-frequency coupler comprising:

a magnetic-field-generating pattern that generates a magnetic field in a certain direction; and a surrounding pattern that is arranged around a periphery of the magnetic-field-generating pattern and that blocks a portion of the magnetic field generated by the magnetic-field-generating pattern, the portion of the magnetic field extending laterally in a plane that includes the magnetic-field-generating pattern and the surrounding pattern; wherein a communication signal is a high-frequency signal of 1 GHz or higher.

19. A high-frequency coupler comprising:

a magnetic-field-generating pattern that generates a magnetic field in a certain direction;

a surrounding pattern that is arranged around a periphery of the magnetic-field-generating pattern and that blocks a portion of the magnetic field generated by the magnetic-field-generating pattern, the portion of the magnetic field extending laterally in a plane that includes the magnetic-field-generating pattern and the surrounding pattern; and a magnetic-field antenna pattern; wherein the magnetic-field-generating pattern and the surrounding pattern are arranged inside the magnetic-field antenna pattern.

* * * * *